(12) United States Patent
Oh

(10) Patent No.: US 9,837,470 B2
(45) Date of Patent: Dec. 5, 2017

(54) METHOD OF MANUFACTURING A SEMICONDUCTOR INTEGRATED CIRCUIT DEVICE INCLUDING A TRANSISTOR WITH A VERTICAL CHANNEL

(71) Applicant: SK hynix Inc., Gyeonggi-do (KR)

(72) Inventor: Dong Yean Oh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/252,568

(22) Filed: Aug. 31, 2016

(65) Prior Publication Data

US 2016/0372519 A1      Dec. 22, 2016

Related U.S. Application Data

(63) Continuation-in-part of application No. 14/842,300, filed on Sep. 1, 2015, now Pat. No. 9,691,819.

(30) Foreign Application Priority Data

Apr. 10, 2015   (KR) .................. 10-2015-0050937
May 13, 2016   (KR) .................. 10-2016-0058609

(51) Int. Cl.
*H01L 21/00*   (2006.01)
*H01L 21/268*   (2006.01)
*H01L 27/24*   (2006.01)
*H01L 45/00*   (2006.01)
*H01L 29/423*   (2006.01)
*H01L 29/78*   (2006.01)
*H01L 29/08*   (2006.01)

(52) U.S. Cl.
CPC ...... *H01L 27/2454* (2013.01); *H01L 29/0847* (2013.01); *H01L 29/42376* (2013.01); *H01L 29/7827* (2013.01); *H01L 29/7831* (2013.01); *H01L 45/065* (2013.01); *H01L 45/126* (2013.01); *H01L 45/1233* (2013.01); *H01L 45/1683* (2013.01); *H01L 45/06* (2013.01)

(58) Field of Classification Search
CPC ........... H01L 27/2454; H01L 29/42376; H01L 29/7827; H01L 29/7831; H01L 29/0847; H01L 45/1683; H01L 45/065; H01L 45/1233; H01L 45/126; H01L 45/06; H01L 27/0629; H01L 27/0727; H01L 27/0738
See application file for complete search history.

(56) References Cited

U.S. PATENT DOCUMENTS

| | | | | |
|---|---|---|---|---|
| 6,440,801 B1 * | 8/2002 | Furukawa | ......... | H01L 27/10808 257/302 |
| 2002/0163027 A1 * | 11/2002 | Skotnicki | ............ | H01L 29/7827 257/302 |
| 2014/0239247 A1 * | 8/2014 | Park | .................... | H01L 27/2454 257/4 |
| 2015/0041899 A1 | 2/2015 | Yang et al. | | |
| 2015/0357432 A1 | 12/2015 | Lin et al. | | |

\* cited by examiner

*Primary Examiner* — Julio J Maldonado
*Assistant Examiner* — Stanetta Isaac
(74) *Attorney, Agent, or Firm* — IP & T Group LLP

(57) ABSTRACT

In a method of manufacturing a semiconductor integrated circuit device, a pillar may be formed on a semiconductor substrate. A hard mask pattern may be formed on a top surface and a portion of a sidewall of the pillar. An electric field-buffering region may be formed in the sidewall of the pillar. A gate insulating layer may be formed on an outer surface of the pillar. A gate may be formed on the gate insulating layer.

16 Claims, 16 Drawing Sheets

METHOD OF MANUFACTURING A SEMICONDUCTOR INTEGRATED CIRCUIT DEVICE INCLUDING A TRANSISTOR WITH A VERTICAL CHANNEL

CROSS-REFERENCES TO RELATED APPLICATION

The present application is a continuation-in-part of application Ser. No. 14/842,300 filed on Sep. 1, 2015 titled "Vertical Transistor And Variable Resistive Memory Device Including The Same" and claims priority under 35 U.S.C. §119(a) to Korean application numbers 10-2016-0058609 filed on May 13, 2016 and 10-2015-0050937 filed on Apr. 10, 2015, in the Korean Intellectual Property Office, which is incorporated herein by reference in its entirety.

BACKGROUND

1. Technical Field

Various embodiments relate generally to a method of manufacturing a semiconductor integrated circuit device.

2. Related Art

A highly integrated semiconductor integrated circuit device may employ a vertical transistor for integrating more memory cells in a small area.

Generally, the vertical transistor may include a gate, a source and a drain. The vertical transistor may include a channel vertically extended from an upper or top surface of a semiconductor substrate. The vertical transistor may include an active region having a pillar shape.

The gate may be configured to surround the pillar. The source may be formed in a portion of the pillar under the gate. The drain may be formed in a portion of the pillar over the gate. The channel of the vertical transistor may be formed in a portion of the pillar between the source and the drain.

However, the pillar channel of the vertical transistor may be floated differently from a channel of a planar type metal-oxide-semiconductor (MOS) transistor and may be more prone to a leakage current.

Particularly, when a voltage is applied to the gate and the drain with a gate insulating layer, a high electric field may be concentrated on an edge portion of the gate, i.e., an overlapped portion between the gate and the drain to generate a gate induced drain leakage (GIDL). The GIDL may be more pronounced in the floated channel.

SUMMARY

According to an embodiment, there is provided a method of manufacturing a semiconductor integrated circuit device, the method including forming a pillar on a semiconductor substrate, then forming a hard mask pattern on a top surface of the pillar and a portion of the pillar sidewall, forming an electric field-buffering region in the sidewall of the pillar, forming a gate insulating layer on an outer surface of the pillar, and forming a gate on the gate insulating layer.

An advantage of the present invention method is that it forms a semiconductor integrated circuit device that may substantially reduce and or prevent GIDL.

BRIEF DESCRIPTION OF THE DRAWINGS

These and other features and advantages of the present invention will become apparent to those skilled in the art to which the present invention pertains from the following detailed description of specific embodiments of the present invention in reference to the accompanying drawings wherein.

DETAILED DESCRIPTION

Figure 1:
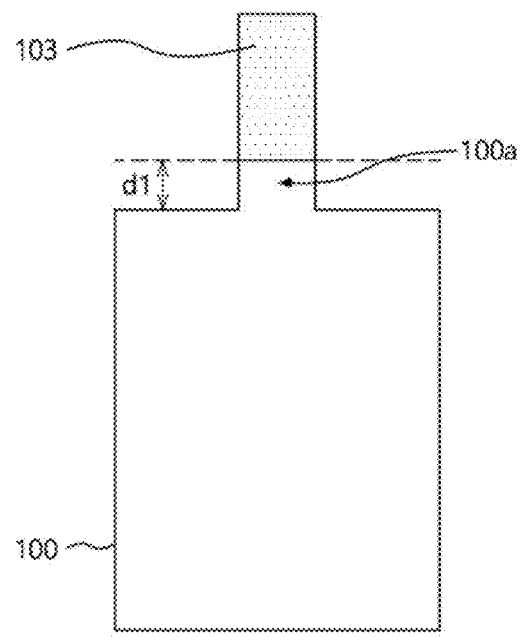
FIGS. 1 to 13 are cross-sectional views illustrating a method of manufacturing a semiconductor integrated circuit device, in accordance with an embodiment of the present invention.

Various embodiments of the present invention will be described hereinafter with reference to the accompanying drawings. The embodiments may, however, be embodied in many different forms and should not be construed as being limited to the embodiments set forth herein. Rather, these embodiments are provided so that this disclosure will be thorough and complete, and will fully convey the present invention to those skilled in the art to which the present invention pertains.

In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in manufacturing, use or operation in addition to the orientation depicted in the figures. For example, if the device in the figures is turned over, elements described as "below" or "under" other elements or features would then be "above" the other elements or features. The device may be otherwise oriented (rotated 90 degrees or at other orientations) and the spatially relative descriptors used herein interpreted accordingly.

The terminology used herein is for the purpose of describing particular examples of embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes," and "including" when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, examples of the embodiments will be explained with reference to the accompanying drawings.

Referring now to FIGS. 1 to 13 a method of manufacturing a semiconductor integrated circuit device is provided in accordance with an embodiment of the present invention.

As shown in FIG. 1, a first hard mask layer 103 may be formed on a portion of the top surface of a semiconductor substrate 100. The first hard mask layer 103 may be used for defining a channel region. The first hard mask layer 103 may include a material having an etching selectivity with respect to a material of the semiconductor substrate 100. For example, the first hard mask layer 103 may include silicon nitride. The semiconductor substrate 100 may be etched using the first hard mask layer 103 as an etch mask to a first depth dl to form a protrusion 100a on the semiconductor substrate 100. The protrusion 100a may have a thickness substantially the same as the first depth dl. The protrusion 100a may be used for defining a position of an electric field-buffering region.

Figure 2:
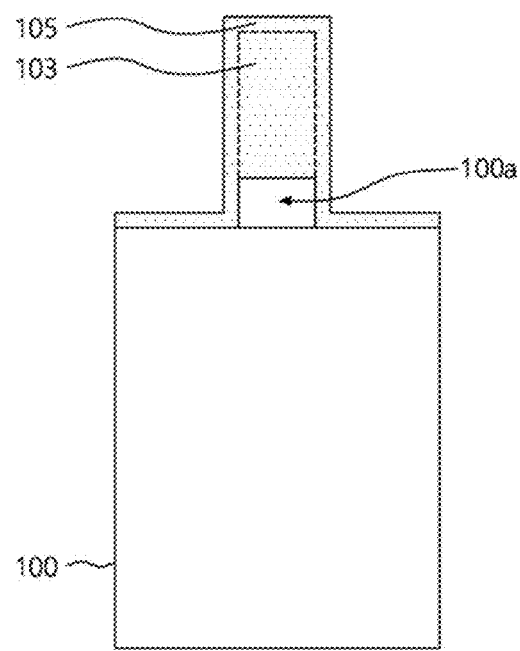

Referring to FIG. 2, a second hard mask layer 105 may be formed on the top surface of the semiconductor substrate 100 having the protrusion 100a and the first hard mask layer 103. The second hard mask layer 105 may cover the top surface of the substrate that is not covered by the protrusion 100a, the sidewall of the protrusion 100a, the sidewall of the first hard mask layer 103, and the top surface of the first hard mask layer 103. In an embodiment, the second hard mask layer 105 may include a material substantially the same as the material of the first hard mask layer 103.

Figure 3:
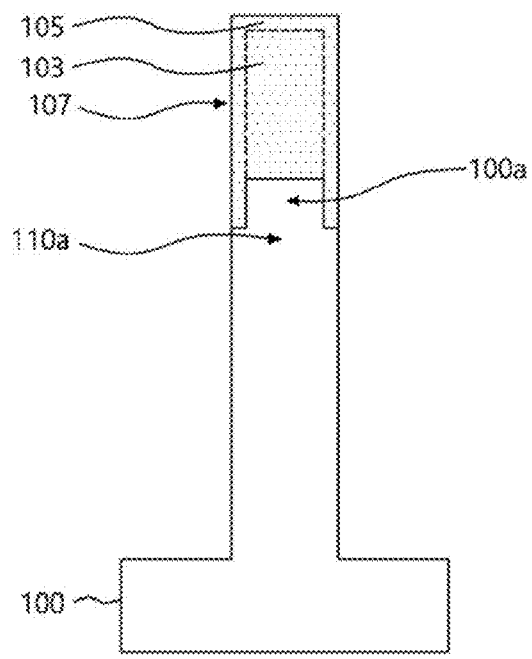

Referring to FIG. 3, the second hard mask layer 105 may be anisotropically etched. Specifically, the etched second hard mask layer 105 may remain on the top surface of the first hard mask layer 103, the sidewall of the first hard mask layer 103 and the sidewall of the protrusion 100a. Thus, a hard mask pattern 107 including the first hard mask layer 103, and the etched second hard mask layer 105 may be formed on the semiconductor substrate 100. The semiconductor substrate 100 may be etched using the hard mask pattern 107 as an etch mask to form a preliminary pillar 110a.

Figure 4:
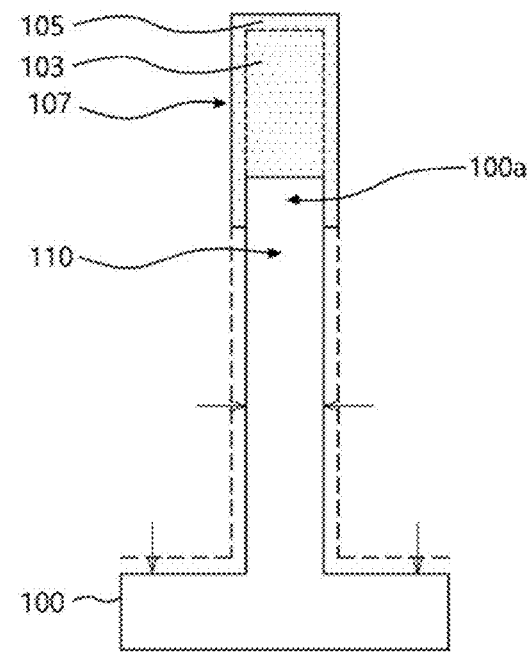

Referring to FIG. 4, the thickness of the preliminary pillar 110a and the semiconductor substrate 100 may be slimmed by a thickness equal to the thickness of the second hard mask layer 105 in the hard mask pattern 107. The slimming process may include a process for etching the preliminary pillar 110a and the semiconductor substrate 100 using the hard mask pattern 107 as an etch mask. Thus, a pillar 110 corresponding to an active region of a vertical transistor may be formed by the slimming process.

Figure 5:
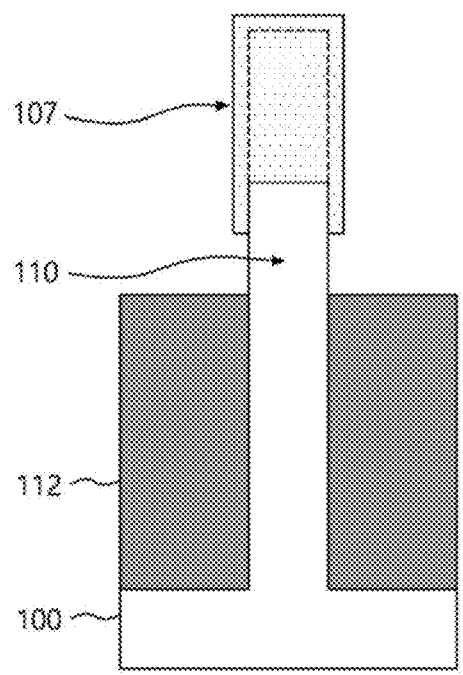

Referring to FIG. 5, a first insulating layer 112 may be formed on the top surface of the semiconductor substrate 100 following the slimming process, to fill up spaces at both sides of the pillar 110. The top surface of the first insulating layer 112 may be spaced apart from a lowermost (bottom) surface of the hard mask pattern 107 leaving an upper portion of the sidewall of the pillar 110 exposed. Hence, the first insulating layer may fully surround a lower portion of the sidewall of the pillar 110 and may leave exposed a remaining upper portion of the sidewall of the pillar 110. The lower portion of the sidewall of the pillar 110 that is surrounded by the first insulating layer 112 may be substantially longer than the upper exposed portion of the sidewall of the pillar 110. In an embodiment, the first insulating layer 112 may include silicon oxide.

Figure 6:
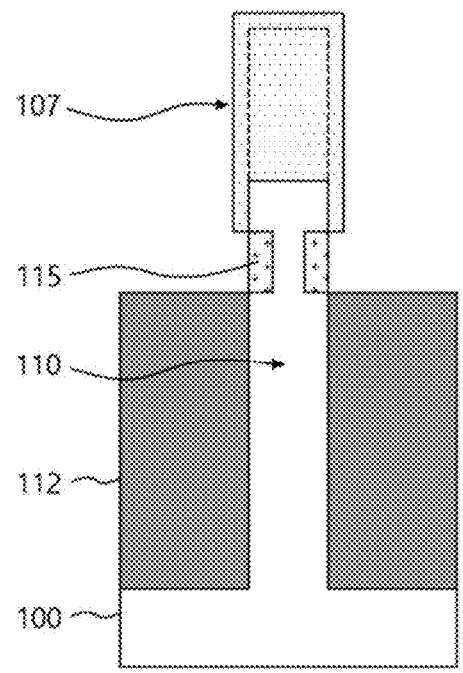

Referring to FIG. 6, an electric field-buffering region 115 may be formed on the exposed sidewall of the pillar 110. That is, the electric field-buffering region 115 may be formed on the upper portion of the sidewall of the pillar 110 which are not surrounded by the first insulating layer 112. The electric field-buffering region 115 may be formed by doping at least one of Ge, SiGe, SiC, and the like, into the exposed sidewall of the pillar 110. For example, the doping process may include a plasma doping process or PLAD (pulsed laser Ablation Deposition). The electric field-buffering region 115 may be formed to include a semiconductor material having a band gap different from a band gap of the semiconductor material (e.g., of silicon) in the pillar 110. For example, when an NMOS transistor is manufactured, the electric field-buffering region 115 may include a semiconductor material having a band gap less than a band gap of the semiconductor material in the pillar 110. In contrast, when a PMOS transistor is manufactured, the electric field-buffering region 115 may include a semiconductor material having a band gap greater than a band gap of the semiconductor material in the pillar 110.

The electric field-buffering region 115 on the upper portion of the sidewall of pillar 110 may correspond to a portion of a drain. Further, the electric field-buffering region 115 may be positioned to correspond to an edge portion of a gate so that the electric field-buffering region 115 may function as to increase a work function of the drain. As a result, a ratio of the work function between the gate and the drain may be decreased to reduce a leakage current due to a gate induced drain leakage (GIDL).

The drain may be formed in an upper portion of the pillar 110 with the electric field-buffering region 115. The source may be formed in a lower portion of the pillar 110. The processes for forming the drain and the source may be performed after the slimming process of the preliminary pillar 110a to form the pillar 110 illustrated with reference to FIG. 4. Alternatively, the processes for forming the drain and the source may be performed in the process of exposing the pillar 110.

Figure 7:
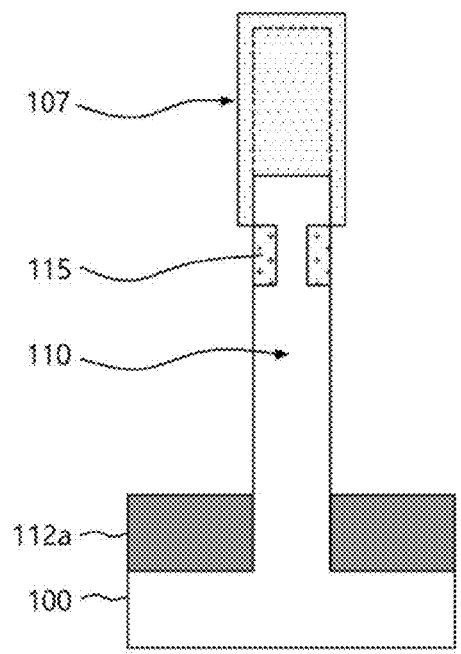

Referring now to FIG. 7, the first insulating layer 112 is partially recessed exposing a portion of the sidewall of the pillar 110 extending between the lowermost surface of the electric field buffering region 115 and a recessed first insulating layer 112a.

Figure 8:
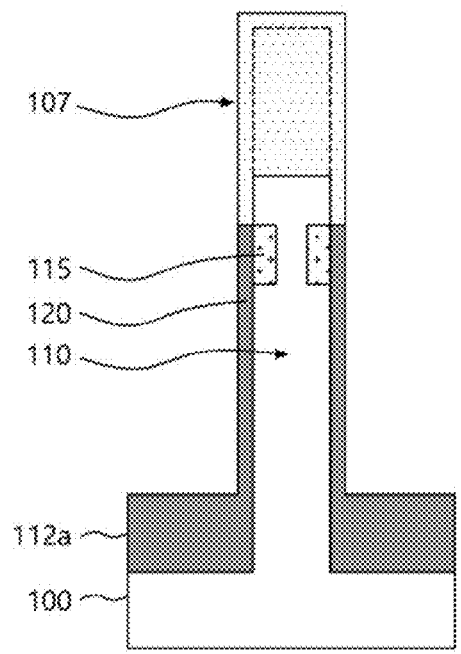

Referring to FIG. 8, a gate insulating layer 120 may be formed to surround the exposed portion of the sidewall of the pillar 110 and the sidewall of the electric field buffering region 115. For example, the gate insulating layer 120 may be formed by an oxidizing process.

Figure 9:
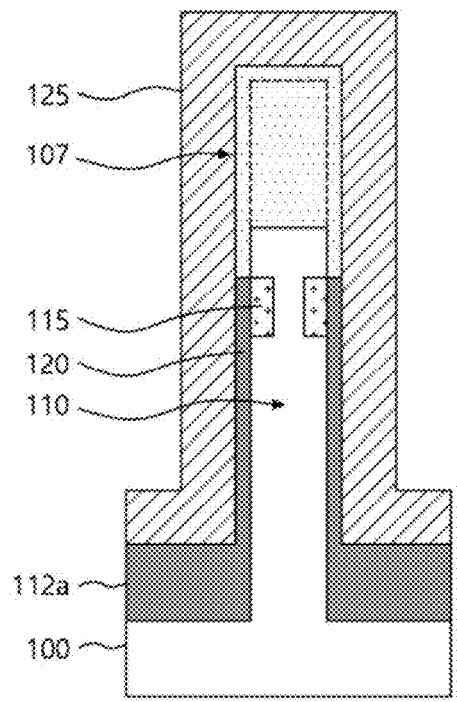

Referring to FIG. 9, a first conductive layer 125 may be formed on the semiconductor substrate 100 having the pillar 110. The first conductive layer 125 may be formed to surround the hard mask pattern 107, the recessed first insulating layer 112a and the gate insulating layer 120 surrounding the pillar 110. The first conductive layer 125 may conform to the contours of the underlying structure and may have a uniform thickness throughout. The thickness of the first conductive layer 125 may vary depending on design, however, the first conductive layer 125 may have a conformal thickness.

Figure 10:
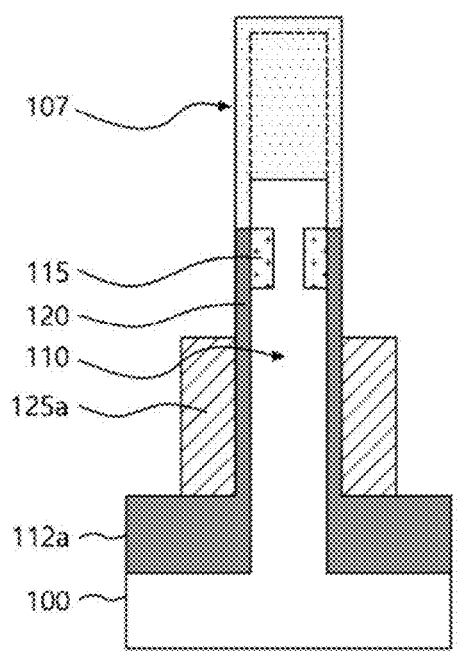

Referring to FIG. 10, the first conductive layer 125 may be anisotropically etched to form a first gate 125a. The etched first conductive layer 125 may be configured to surround a channel region of the pillar 110 to define the first gate 125a. The first gate 125a may have its top surface positioned at a lower level than the lowermost surface of the electric field buffering region 115. The width of the first gate may be less than the width of the recessed first insulating layer 112a.

Figure 11:
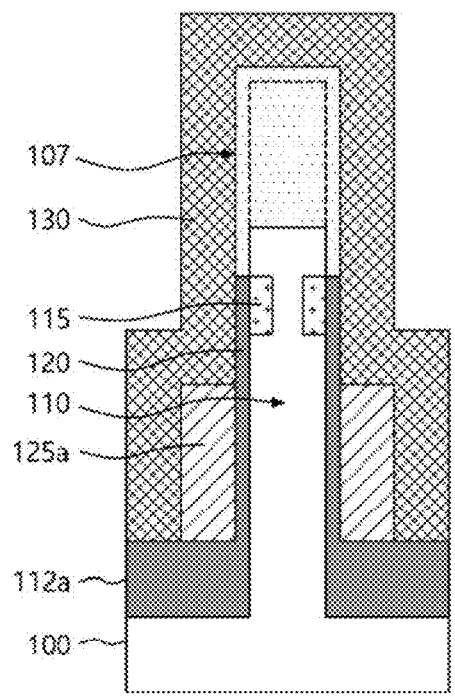

Referring to FIG. 11, a second conductive layer 130 may be formed to conform over the already formed structure which includes the first gate 125a. More specifically, the second conductive layer 130 may be formed to surround the top surface of the hard mask pattern 107, the sidewall of the hard mask pattern 107, a portion of the gate insulating layer 120, the first gate 125a and a portion of the gate insulating layer 120. In an embodiment, the second conductive layer 130 may have a thickness substantially the same as that of the first conductive layer 125. In order to prevent an electric field between the gate and the drain from being concentrated, the second conductive layer 130 may have a material having a work function that is less than a work function of the material of the first gate 125a.

Figure 12:
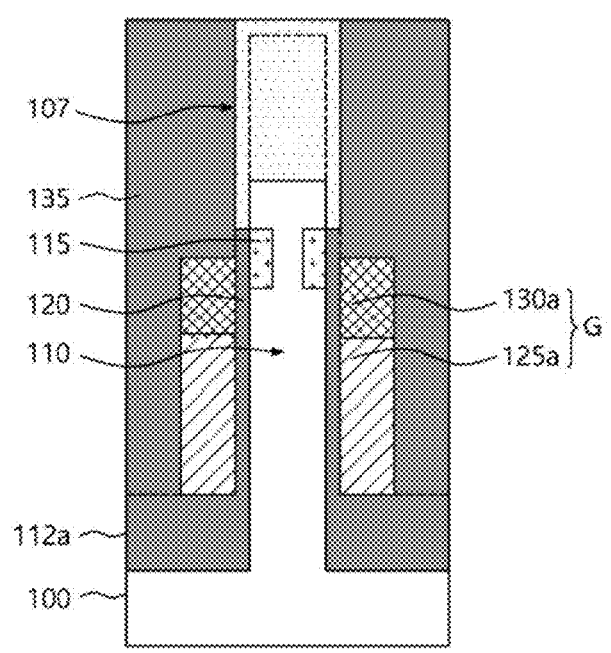

Referring to FIG. 12, the second conductive layer 130 may be anisotropically etched to form a second gate 130a. An etched second conductive layer 130 may remain on the first gate 125a to form a gate structure G. The gate structure G include the first gate 125a and the second gate 130a, thereby forming the vertical transistor including the dual gate. The second gate 130a may have a width that is substantially the same to the width of the first gate 125a. Hence, the first and second gates 125a and 130a may be substantially coextensive in a horizontal direction parallel to the plane of the substrate 100. In the vertical direction, the second gate 130a may extend from the top surface of the first gate to a level that is between the bottom and top surfaces of the electric field buffering region 115. In the illustrated embodiment, the top surface of the second gate 130a is positioned to a level that is about at the middle point between the bottom and top surfaces of the electric field buffering region 115. Because the second gate 130a having the relatively lower work function is positioned adjacent to the drain, a difference of the work functions between the gate and the drain may be more reduced. The electric field-buffering region 115 may be positioned at a region to vertically overlap with the second gate 130a to suppress the electric field from being concentrated.

Referring to FIG. 12, an insulating interlayer 135 may be formed on the recessed first insulating layer 112a and the semiconductor substrate 100 to fill up empty spaces at both sides of the pillar 110. In other words, the Insulating layer 135 may be formed to surround the top surface of the hard mask pattern 107, the sidewall of the hard mask pattern 107, a portion of the recessed first insulating layer 112a that is not covered by the first gate 125a, a portion of the gate insulating layer 120 that is not covered by the gate structure G, the top surface of the gate structure G and the sidewall of the gate structure G. The insulating interlayer 135 may be planarized until a top surface of the hard mask pattern 107 is exposed.

Figure 13:
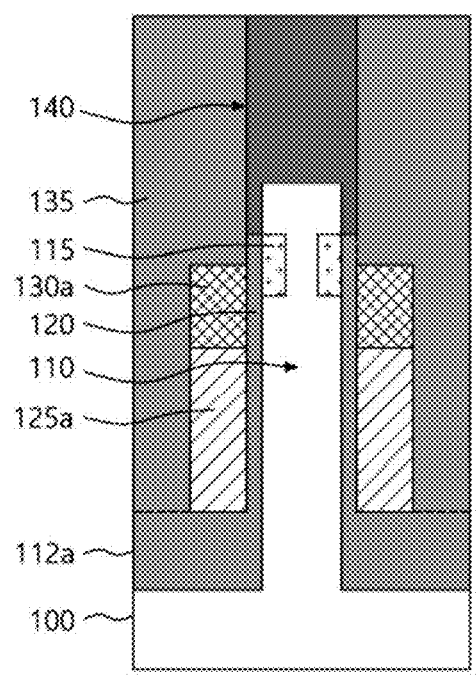

Referring to FIG. 13, the hard mask pattern 107 may then be selectively removed to expose the top surface and an upper portion of the sidewall of the pillar 110 that is over the level of the top surface of the electric field buffering region 115.

As shown in FIG. 13, a storage medium 140 may be formed in a region where the hard mask pattern 107 is removed to complete the semiconductor integrated circuit device. When the semiconductor integrated circuit device is applied to a phase changeable memory device, the storage medium 140 may include a heating electrode and a phase changeable layer.

According to example embodiments, in order to prevent the electric field from being concentrated on the portion between the drain to which a power voltage is applied and the gate to which a selecting voltage is applied, a layer having a band gap different from that of the channel region is formed in a region corresponding to the gate edge. Thus, a leakage current through the gate edge on which the electric field may be concentrated may be reduced. Further, the work function of the gate may be less than the work function of the drain corresponding to the channel region so that the leakage current may be more decreased.

FIGS. 14 to 27 are cross-sectional views illustrating a method of manufacturing a semiconductor integrated circuit device, in accordance with another embodiment.

Processes for forming a pillar 210 and a second hard mask pattern 207 may be substantially the same as those illustrated with reference to FIGS. 1 to 4. Thus, any further illustrations with respect to the same processes may be omitted herein for brevity.

Figure 14:
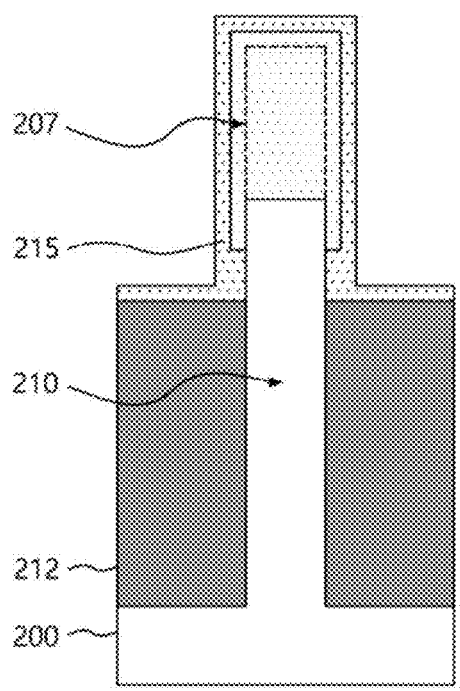
FIGS. 14 to 27 are cross-sectional views illustrating a method of manufacturing a semiconductor integrated circuit device, in accordance with another embodiment of the present invention.

Referring to FIG. 14, a first insulating layer 212 may be formed on a top surface of a semiconductor substrate 200 to fill up spaces at both sides of the pillar 210. The first insulating layer 212 may be spaced apart from a bottom surface of the second hard mask pattern 207 leaving exposed a portion of the pillar 210.

A third hard mask layer 215 may be formed on the surface of the first insulating layer 212, the sidewall of the exposed portion of the pillar 210, the top surface and the sidewall of the second hard mask pattern 207. The third hard mask layer 215 may include a material having an etching selectivity with respect to the material of the second hard mask pattern 207 and the material of the pillar 210. For example, the third hard mask layer 215 may include a silicon boron nitride (SiBN).

Figure 15:
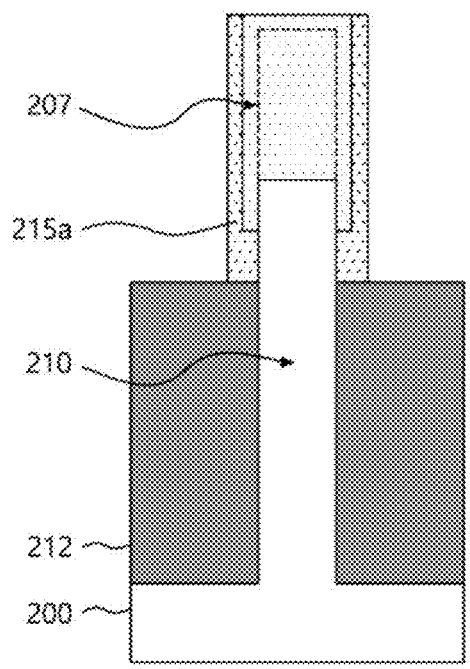

Referring to FIG. 15, the third hard mask layer 215 may be anisotropically etched to form the third hard mask layer 215a. In other words, the third hard mask layer 215a may be formed by removing the third hard mask layer 215 from the top surface of the second hard mask pattern 207 and a portion of the third hard mask layer 215 extending over the top surface of the first insulating layer 112a except for that part of the third mal layer 215 that is adjacent to the pillar 210. Hence, the third hard mask layer 215a may surround the sidewall of the second hard pattern 207, and the portion of the pillar 210 between the top surface of the first insulating layer 212 bottom surface of the second hard mask pattern 207. The bottom surface of the third mask layer 215a abuts a portion of the top surface of the first insulating layer 212.

Figure 16:
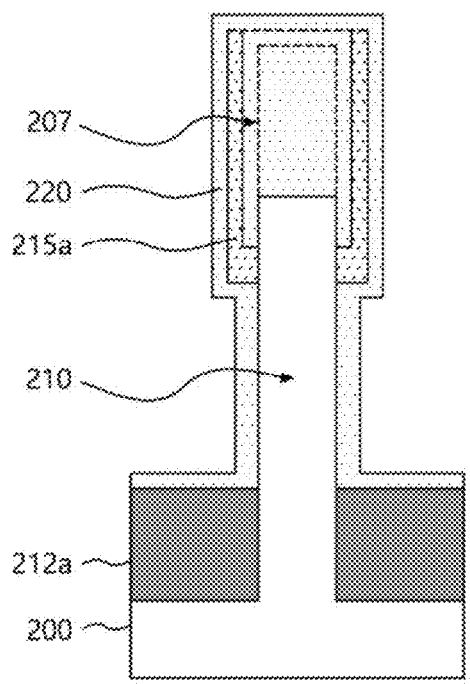

Referring to FIG. 16, the first insulating layer 212 may be recessed to a recessed first insulating layer 212a and a fourth hard mask layer 220 having a conformal thickness may be formed on the top surface of the recessed first insulating layer 212a, the sidewall of a portion of the pillar 210, the sidewall of a third hard mask layer 215a, the top surface of the second hard mask pattern 207, and the sidewall of the second hard mask pattern 207. In an embodiment, the fourth hard mask layer 220 may include a material substantially the same as the material of the second hard mask pattern 207.

Figure 17:
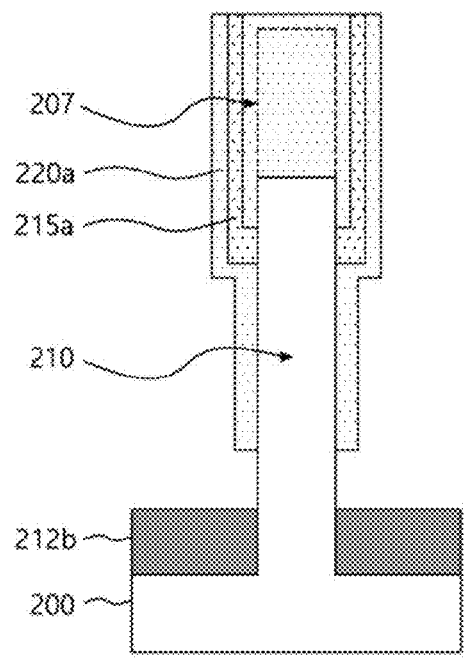

Referring to FIG. 17, the fourth hard mask layer 220 may be anisotropically etched to form an etched fourth hard mask layer 220a. The etched fourth hard mask layer 220a may remain to surround the sidewall of the third hard mask layer 215a and the sidewall of the pillar 210. The first insulating layer 212a may then be recessed to expose a lower sidewall of the pillar 210 to form a recessed first insulating layer 212b.

Figure 18:
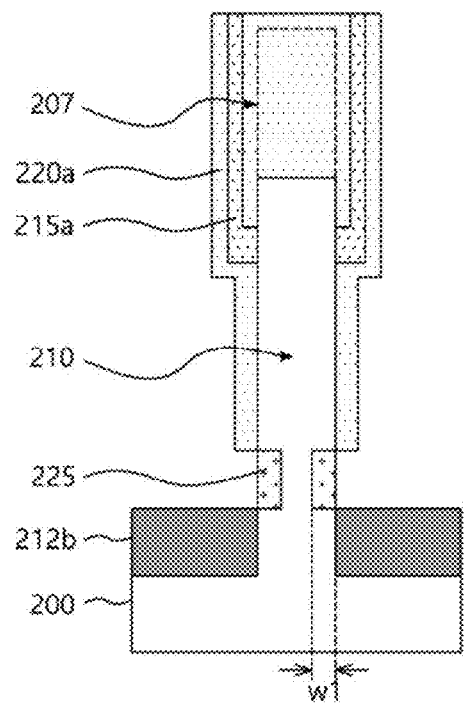

Referring to FIG. 18, a plasma doping process or a PLAD process may be performed on the exposed lower sidewall of the pillar 210 to form a lower electric field-buffering region 225. The lower electric field-buffering region 225 may include a material having a band gap that is different from that of the material in the pillar 210 in accordance with types of MOS transistors. For example, the lower electric field-buffering region 225 may include at least one of a Ge, SiGe, GaAs, SiC, and the like. The lower electric field-buffering region 225 may have a width w1 determined in accordance with an electron mobility of a channel region.

Figure 19:
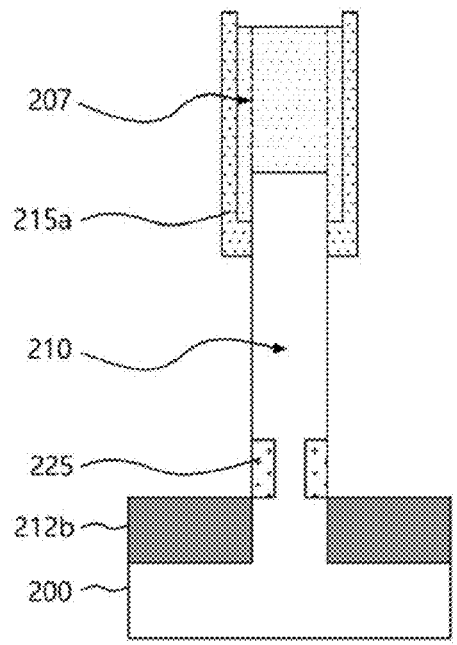

Referring to FIG. 19, the fourth hard mask layer 220a may be selectively removed to expose the sidewall of the pillar 210. An upper portion of the second hard mask pattern 207 may be partially removed to expose the first hard mask layer 203 in removing the second hard mask layer 220a.

Figure 20:
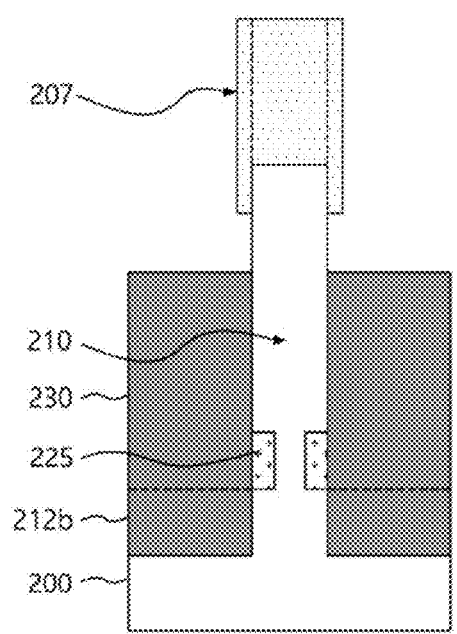

Referring to FIG. 20, an additional insulating layer may be formed on the top surface of the recessed first insulating layer 212b to fill up spaces outside the pillar 210. The additional insulating layer may be recessed to form a second insulating layer 230. The second insulating layer 230 may have its top surface substantially coplanar with the bottom surface of the third hard mask layer 215a. The third hard mask layer 215a may be selectively removed to partially expose an upper sidewall of the pillar 210.

Figure 21:
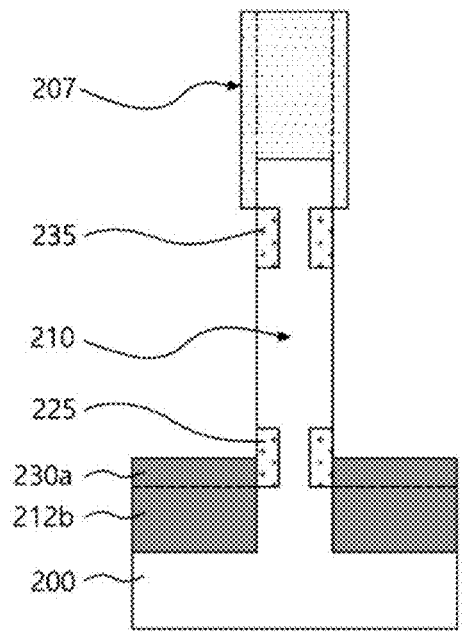

Referring to FIG. 21, a plasma doping process or a PLAD process may be performed on the upper sidewall of the pillar 210 to form an upper electric field-buffering region 235. In an embodiment, the upper electric field-buffering region 235 may have an impurity type substantially the same as that of the lower electric field-buffering region 225. The second insulating layer 230 may be partially or wholly removed to expose the sidewall of the pillar 210, thereby forming the removed second insulating layer 230a and the pillar 210 including the upper electric field-buffering region 235 and the lower electric field-buffering region 225.

Figure 22:
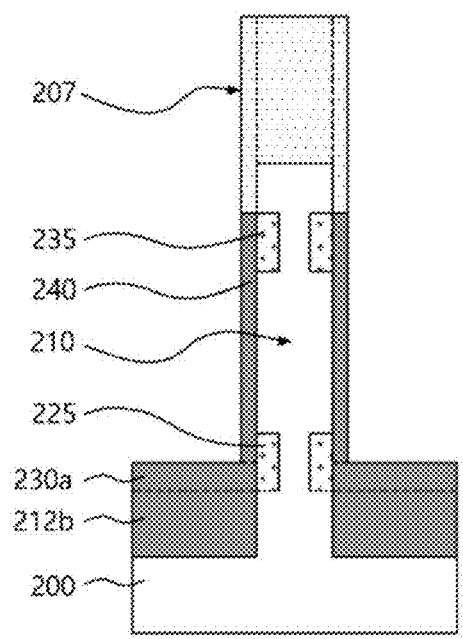

Referring to FIG. 22, a gate insulating layer 240 may be formed on the sidewall of the pillar 210. In an embodiment, the gate insulating layer 240 may be formed by an oxidation process.

Figure 23:
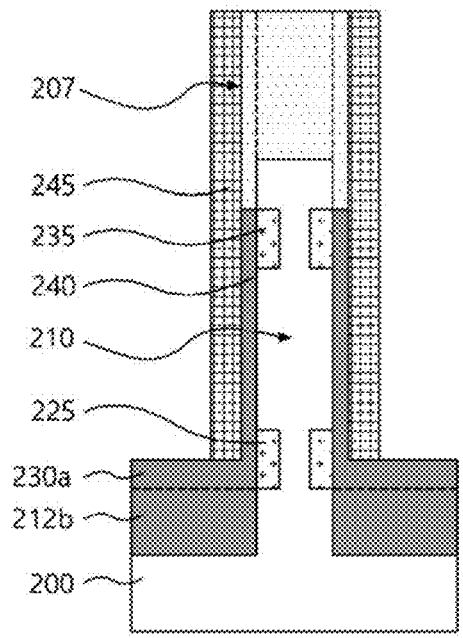

Referring to FIG. 23, a first conductive layer 245 may be formed on the pillar 210 and over the first insulating layer 212b. That is, the first conductive layer 245 may be formed on the sidewall of the pillar 210 and the removed second insulating layer 230a on the first insulating layer 212b. The first conductive layer 245 may include a material having a first work function. The first conductive layer 245 may be anisotropically etched to form a spacer on the sidewall of the pillar 210.

Figure 24:
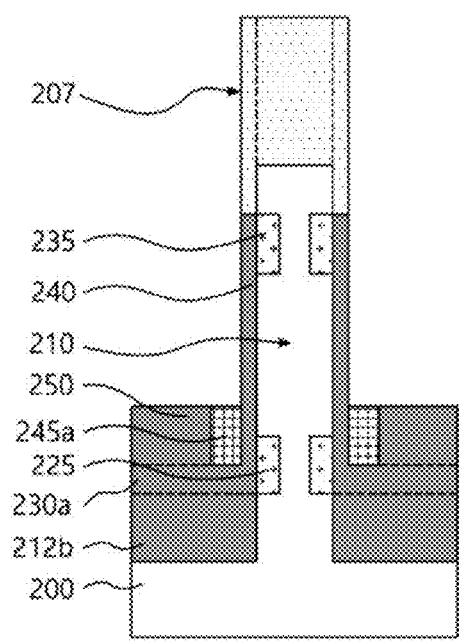

Referring to FIG. 24, a third insulating layer 250 may be formed over a top surface of the first insulating layer 212b. That is, the third insulating layer 250 may be formed on the removed second insulating layer 230a on the first insulating layer 212b. The third insulating layer 250 may function to define a height of a first gate formed at a portion adjacent to a source. For example, after the third insulating layer 250 is formed to fill up the spaces at the both sides of the pillar 210, the third insulating layer 250 may be recessed to have a thickness corresponding to the height of the first gate. The first conductive layer 245 may be recessed to the top surface of the third insulating layer 250 to form a first gate 245a. The first gate 245a may have a bottom surface, i.e., a lower edge corresponding to the lower electric field-buffering region 225.

Figure 25:
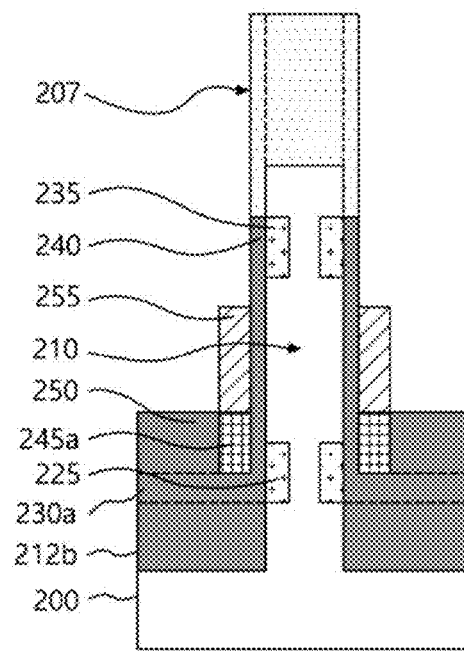

Referring to FIG. 25, a second conductive layer (not shown) may be formed on the third insulating layer 250, the first gate 245a and the sidewall of the pillar 210. The second conductive layer may include a material having a second work function greater than the first work function. The second conductive layer may have a thickness substantially the same as that of the first conductive layer 245 of FIG. 23. The second conductive layer may be anisotropically over-etched to form a second gate 255 on the sidewall of the pillar 210 over the first gate 245a. Because the second gate 255 may be formed by the anisotropic over-etching process, the second gate 255 may have a height less than that of the pillar 210. For example, the 25 second gate 255 may be configured to surround a channel region between the lower electric field-buffering region 225 and the upper electric field-buffering region 235.

Figure 26:
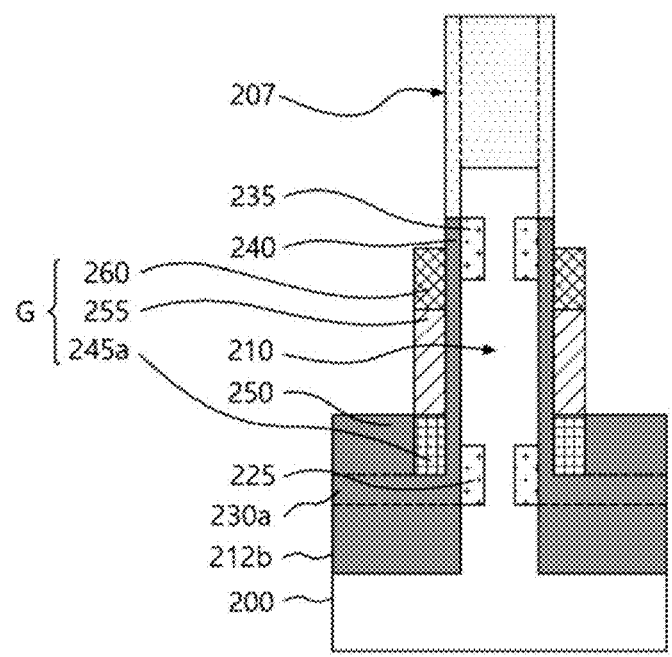

Referring to FIG. 26, a third conductive layer may be formed on the second gate 255. The third conductive layer (not shown) may have a thickness substantially the same as that of the first conductive layer 245 of FIG. 23. The third conductive layer may include a material having a work function less than the second work function of the second gate 255. The work function of the third conductive layer may be substantially the same as or less than the work function of the material in the first gate 245a. The third conductive layer may be anisotropically etched to form a third gate 260 on the second gate 255. As a result, a surround gate G including the three stacked layers having the different work functions may be completed. That is, the gate G including the first gate 245a, the second gate 255 and the third gate 260 is formed. The first gate 245a adjacent to the lower portion of the pillar 210 corresponding to the source and the third gate 260 adjacent to the upper portion of the pillar 210 corresponding to the drain may have the work functions lower than the work function of the second gate 255 to effectively prevent the generation of the GIDL. The work functions of the gates may be determined in accordance with types of the MOS transistors.

The bottom edge portion of the first gate 245a may overlap in the horizontal direction with the lower electric field-buffering region 225. In other words, the bottom surface of the first gate 245a lies at a level that is between the levels of the top and bottom surfaces of the lower electric field-buffering region 225. The top edge portion of the third gate 260 may overlap in the horizontal direction with the upper electric field-buffering region 235. In other words, the top surface of the third gate 260 lies at a level that is between the levels of the top and bottom surfaces of the upper electric field-buffering region 235. Therefore, the concentration of the electric field on the gate edge may be suppressed.

Figure 27:
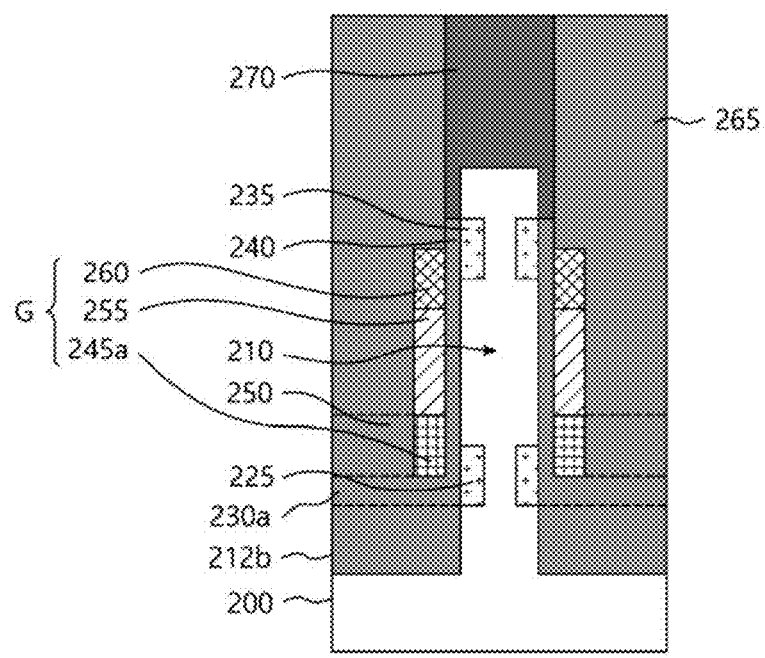

Referring to FIG. 27, an insulating interlayer 265 may be formed on the semiconductor substrate 200 including the surround gate G to cover the pillar 210. The insulating interlayer 265 may include a material having an etching selectivity with respect to the hard mask pattern 207 of FIG. 26. For example, the Insulating interlayer 265 may include silicon oxide. The insulating interlayer 265 may be planarized to have its top surface substantially coplanar with that of the hard mask pattern 207. After performing the planarization process, the hard mask pattern 207 may be selectively removed to partially expose the top surface and the sidewall of the pillar 210.

A storage medium 270 may be formed in a space formed by removing the hard mask pattern 207 to form a semiconductor integrated circuit device. When the semiconductor integrated circuit device may be applied to a phase changeable memory device, the storage medium 270 may include a heating electrode and a phase changeable layer.

In some embodiments, ion implantation processes for forming the source and the drain may be omitted for brevity. The ion plantation process may be performed in exposing the pillar after forming the pillar.

According to example embodiments, the electric field-buffering regions may be formed in the source and the drain of the vertical transistor. Further, the gates corresponding to the electric field-buffering regions may have the relatively low work functions to suppress the generation of the leakage current through the gate edge on which the electric field may be concentrated.

Figure 28:
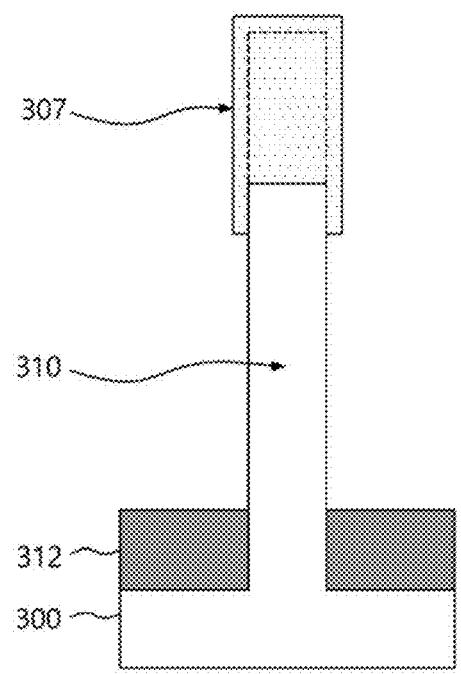
FIGS. 28 to 30 are cross-sectional views illustrating a method of manufacturing a semiconductor integrated circuit device, in accordance with yet another embodiment of the present invention.
Figure 29:
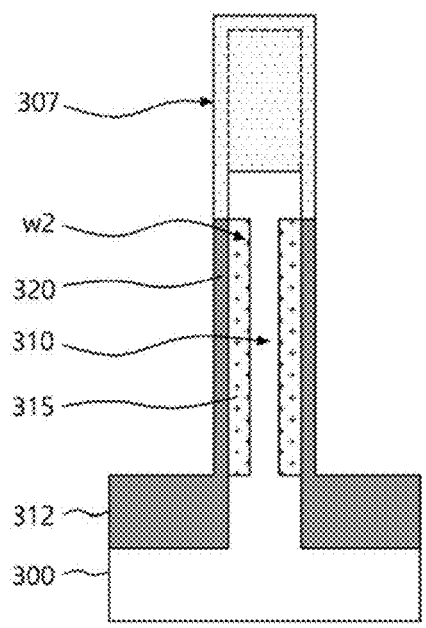
Figure 30:
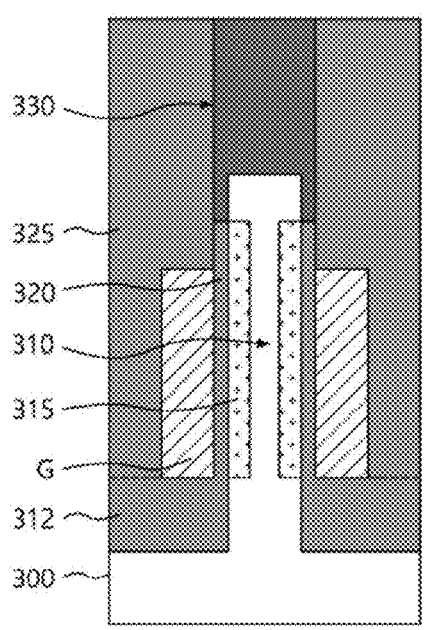

FIGS. 28 to 30 are cross-sectional views illustrating a method of manufacturing a semiconductor integrated circuit device in accordance with yet another embodiment.

Processes for forming a pillar 310 and a hard mask pattern 307 may be substantially the same as those illustrated with reference to FIGS. 1 to 4. Thus, any further illustrations with respect to the same processes may be omitted herein for brevity.

Referring to FIG. 28, a first insulating layer 312 may be formed on an top surface of a semiconductor substrate 300 to fill up spaces at both sides of the pillar 310. The first insulating layer 312 may be recessed to be positioned under a lower portion of the pillar 310. Thus, a sidewall of the pillar 310 may be exposed by the first insulating layer 312.

Referring to FIG. 29, the sidewall of the pillar 310 may be doped with impurities having a band gap different from that of the silicon in the pillar 310 to form an electric field-buffering region 315. When the vertical transistor may include an NMOS transistor, the electric field-buffering region 315 may include a material having a band gap less than that of the silicon material. For example, the electric field-buffering region 315 may include Ge, SiGe, GaAs, etc. When the vertical transistor includes a PMOS transistor, the electric field-buffering region 315 may include a material having a band gap greater than that of silicon. For example, the electric field-buffering region 315 may include SiC. The electric field-buffering region 315 may be formed on the sidewall of the pillar 310. The electric field-buffering region 315 may have a width w2 determined in accordance with an electron mobility of the transistor. For example, the width w2 of the electric field-buffering region 315 may be about 10% to about 20% of a diameter of the pillar 310. The electric field-buffering region 315 may be formed by a plasma doping process or a PLAD. The exposed surface of the pillar 310 may be oxidized to form a gate insulating layer 320.

Referring to FIG. 30, a surround gate G may be formed on the sidewall of the pillar 310. The electric field-buffering region 315 may have a length longer than that of the surround gate G. Thus, the electric field may not be concentrated on the edge of the gate G.

An insulating interlayer 325 may be formed at the both sides of the pillar 310. The insulating interlayer 325 may include a material having an etching selectivity with respect to the hard mask pattern 307. The insulating interlayer 325 may be planarized until the top surface of the hard mask pattern 307 is exposed.

The hard mask pattern 307 may be selectively removed. A storage medium 330 may be formed in a space formed by removing the hard mask pattern 307 to form a semiconductor integrated circuit device. When the semiconductor integrated circuit device may be applied to a phase changeable memory device, the storage medium 330 may include a heating electrode and a phase changeable layer.

In example embodiments, ion implantation processes for forming the source and the drain may be omitted for brevity. The ion plantation process may be performed in exposing the pillar after forming the pillar.

Figure 31:
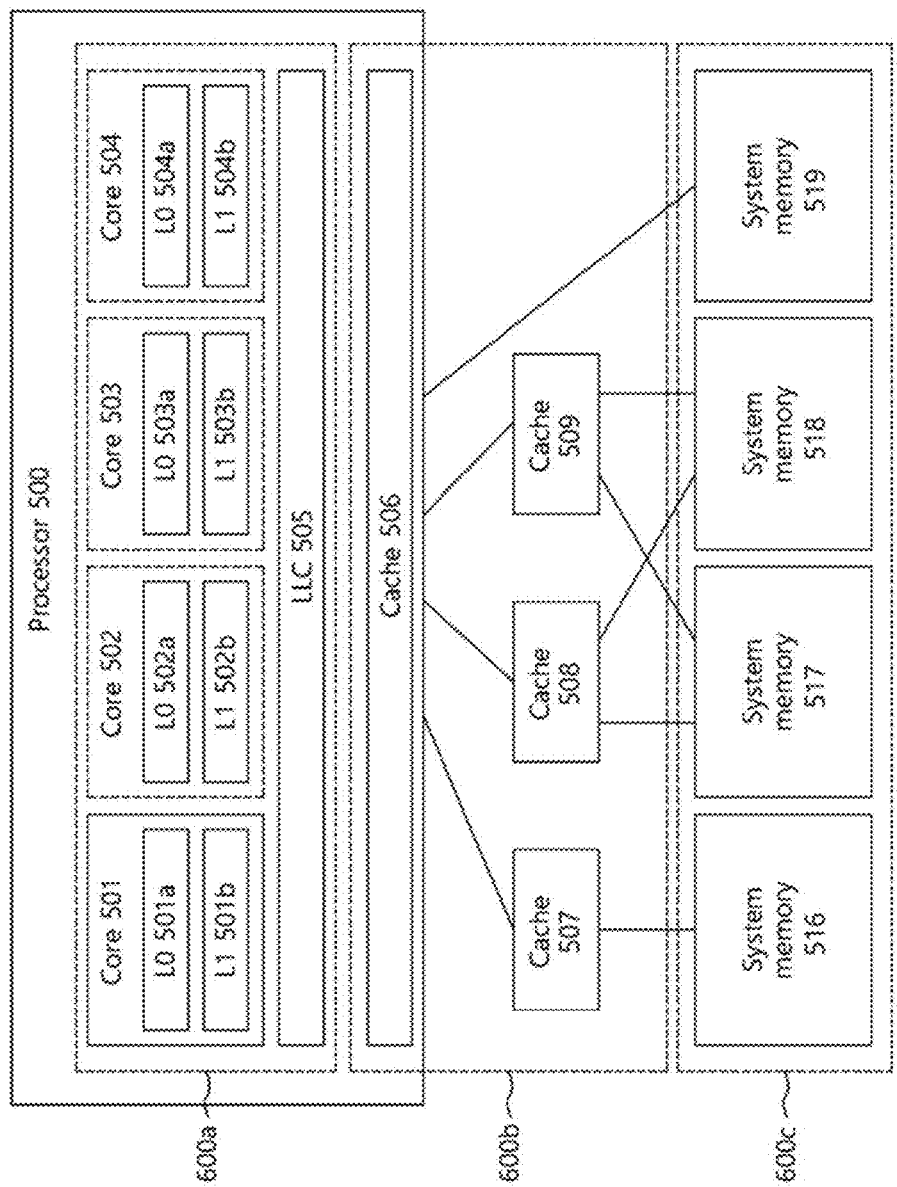
FIG. 31 is a block diagram illustrating a computer system, in accordance with an embodiment of the present invention.

FIG. 31 is a block diagram illustrating a computer system in accordance with an embodiment of the present invention.

Referring to FIG. 31, the computer system may include a processor 500, a cache memory 506 to 509 and a plurality of system memories 516 to 519.

The processor 500 may include a plurality of cores 501 to 504. Each of the cores 501 to 504 may include an upper level of caches L0: 501a to 504a and a middle level of caches L1: 501b to 504b. The upper level of the caches L0: 501a to 504a and the middle level of the caches L1: 501b to 504b may be dedicated to the corresponding cores 501 to 504.

The processor 500 may include lower level of caches LLC: 505 commonly shared with the cores 501 to 504. The processor 500 may further include a common cache 506 provided as a near memory.

A cache group may include a plurality of sub-caches 507 to 509. The cache group may be arranged between the processor 500 and the system memories 516 to 519. The sub-caches 507 to 509 may be operated to correspond to the system memories 516 to 519 divided by addresses. For example, the first sub-cache 507 may be used as a memory controller of the first system memory 516 corresponding to a first address section. The second sub-cache 508 may be used as a memory controller for controlling a non-overlapped portion between the second system memory 517 and the third system memory 518 corresponding to a second address section.

The system memories 516 to 519 may include a memory configured to be directly accessed to software activated on the processor 500. In contrast, the caches 501a to 509 may be aided to activations of commands by the cores 501 to 504 under the activation of the software. The system memories 516 to 519 may be manually operated as a part of the processor 500 and/or automatically operated by the software.

The system memories 516 to 519 may include a far memory and a near memory. The far memory and the near memory may be used in the semiconductor integrated circuit device including the vertical transistor with the electric field-buffering region.

The computer system may be interfaced with a dual in-line memory module (DIMM) as a storage device including the semiconductor integrated circuit device. The semiconductor integrated circuit device in the DIMM may include the vertical transistor having the electric field-buffering region.

The DIMM and the computer system may use a dynamic random access memory (DRAM) channel such as a DDR3, DDR4, DDR5, etc., as an interface. Reference numerals 600*a*, 600*b* and 600*c* may indicate a cache for an internal processor, a near memory operated as a remote memory cache, and a system memory, respectively.

The above embodiments of the present disclosure are illustrative and not limitative. Various alternatives and equivalents are possible in view of the present disclosure without departing from the scope of the appended claims.

What is claimed is:

1. A method of manufacturing a semiconductor integrated circuit device, the method comprising:
    forming a pillar on a semiconductor substrate;
    forming a hard mask pattern for covering a top surface and an upper sidewall of the pillar;
    forming an electric field-buffering region in a selected portion of the sidewall of the pillar, wherein the selected portion is defined by the hard mask pattern;
    forming a gate insulating layer on the pillar; and
    forming a gate on the gate insulating layer,
    wherein forming the electric field-buffering region comprises doping the selected portion of the sidewall of the pillar, with one selected from a group including Ge, SiGe, GaAs and SiC.

2. The method of claim 1, wherein forming the pillar comprises forming the pillar on a top surface of the semiconductor substrate.

3. The method of claim 1, wherein forming the electric field-buffering region comprises:
    forming an insulating layer in spaces at both sides of the pillar to shield a sidewall of the pillar exposed from the hard mask pattern;
    recessing the insulating layer by a first preset thickness, to expose the selected portion of the sidewall of the pillar from the hard mask pattern and the recessed insulating layer; and
    doping the selected portion of the sidewall of the pillar with impurities having a band gap different from that of the pillar to form the electric field-buffering region.

4. The method of claim 3, wherein the electric field-buffering region is formed by a PLAD (pulsed laser Ablation Deposition).

5. The method of claim 3, further comprising recessing the insulating layer by a second preset thickness after forming the electric field-buffering region and before forming the gate insulating layer.

6. The method of claim 1, wherein forming the gate comprises:
    forming a first conductive layer over the semiconductor substrate; and
    anisotropically etching the first conductive layer to form a first gate.

7. The method of claim 6, wherein forming the gate further comprises:
    forming a second conductive layer over the semiconductor substrate with the first gate, the second conductive layer having a work function lower than that of the first conductive layer; and
    anisotropically etching the second conductive layer to form a second gate on the first gate.

8. The method of claim 1, wherein forming the electric field-buffering region comprises:
    forming a lower electric field-buffering region in a lower portion of the sidewall of the pillar; and
    forming an upper electric field-buffering region in an upper portion of the sidewall of the pillar.

9. The method of claim 8, wherein forming the lower electric field-buffering region comprises:
    forming a first insulating layer in spaces at both sides of the pillar under the hard mask pattern to shield a sidewall of the pillar exposed from the hard mask pattern;
    forming a first hard mask layer on the first insulating layer and the hard mask pattern, the first hard mask layer having an etching selectivity with respect to the hard mask pattern;
    anisotropically etching the first hard mask layer to remove a portion of the first hard mask layer on the first insulating layer;
    primarily recessing the first insulating layer;
    forming a second hard mask layer on the recessed first insulating layer, the first hard mask layer and the hard mask pattern;
    anisotropically etching the second hard mask layer to remove a portion of the second hard mask layer on the recessed first insulating layer;
    secondarily recessing the first insulating layer to expose a lower portion of the sidewall of the pillar; and
    doping the exposed lower portion of the sidewall of the pillar with impurities to form the lower electric field-buffering region.

10. The method of claim 9, wherein foil ling the upper electric field-buffering region comprises:
    selectively removing the second hard mask layer after forming the lower electric field-buffering region;
    forming a second insulating layer in the spaces at the both sides of the pillar under the first hard mask layer;
    selectively removing the first hard mask layer; and
    doping the exposed upper portion of the sidewall of the pillar with impurities to form the upper electric field-buffering region.

11. The method of claim 8, wherein forming the gate comprises:
    forming a first gate on a lower portion of the pillar;
    forming a second gate on the first gate; and
    forming a third gate on the second gate.

12. The method of claim 11, wherein the first and third gates comprise a material having a work function lower than that of a material in the second gate.

13. The method of claim 12, wherein the lower electric field-buffering region is formed to be corresponded to a lower edge of the first gate and the upper electric field-buffering region is fainted to be corresponded to an upper edge of the third gate.

14. The method of claim 1, wherein forming the electric field-buffering region comprises:
    forming an insulating layer on the semiconductor substrate at both sides of the pillar to expose the sidewall of the pillar; and
    doping an exposed sidewall of the pillar with impurities to form the electric field-buffering region.

15. The method of claim 14, wherein the gate has a length shorter than that of the electric field-buffering region.

16. The method of claim 1, further comprising:
   forming an insulating interlayer in spaces at both sides of the pillar having the gate;
   planarizing the insulating interlayer to expose an top surface of the hard mask pattern;
   selectively removing the hard mask pattern; and
   forming a storage medium in a space formed by removing the hard mask pattern.

* * * * *